(12) United States Patent
Schowalter et al.

(10) Patent No.: US 7,211,146 B2
(45) Date of Patent: *May 1, 2007

(54) POWDER METALLURGY CRUCIBLE FOR ALUMINUM NITRIDE CRYSTAL GROWTH

(75) Inventors: Leo J. Schowalter, Latham, NY (US); Glen A. Slack, Scotia, NY (US)

(73) Assignee: Crystal IS, Inc., Green Island, NY (US)

( * ) Notice: Subject to any disclaimer, the term of this patent is extended or adjusted under 35 U.S.C. 154(b) by 354 days.

This patent is subject to a terminal disclaimer.

(21) Appl. No.: 10/822,336

(22) Filed: Apr. 12, 2004

(65) Prior Publication Data

US 2005/0223967 A1 Oct. 13, 2005

Related U.S. Application Data

(63) Continuation-in-part of application No. 10/251,106, filed on Sep. 20, 2002, now Pat. No. 6,719,843.

(60) Provisional application No. 60/323,947, filed on Sep. 21, 2001.

(51) Int. Cl.
*C30B 11/06* (2006.01)
(52) U.S. Cl. .................... 117/220; 117/221; 117/82; 117/83; 117/84
(58) Field of Classification Search ............... 117/220, 117/221, 82, 83, 84
See application file for complete search history.

(56) References Cited

U.S. PATENT DOCUMENTS

| | | | |
|---|---|---|---|
| 4,234,554 A | 11/1980 | Rabenau et al. | |
| 5,858,085 A | 1/1999 | Arai et al. | |
| 5,858,086 A | 1/1999 | Hunter | |
| 5,909,036 A | 6/1999 | Tanaka et al. | |
| 5,972,109 A | 10/1999 | Hunter | |
| 6,001,748 A | 12/1999 | Tanaka et al. | |
| 6,045,612 A | 4/2000 | Hunter | |

(Continued)

FOREIGN PATENT DOCUMENTS

JP 02 018379 A 1/1990

(Continued)

OTHER PUBLICATIONS

Dryburgh, "Estimation of maximum growth rate for aluminum nitride crystals by direct sublimation", *J. Crystal Growth* 125, 65-68 (1992).

(Continued)

*Primary Examiner*—Robert Kunemund
(74) *Attorney, Agent, or Firm*—Goodwin Procter LLP

(57) ABSTRACT

A crucible for growing III-nitride (e.g., aluminum nitride) single crystals is provided. The crucible includes an elongated wall structure defining an interior crystal growth cavity. Embodiments include a plurality of grains and a wall thickness of at least about 1.5 times the average grain size. In particular embodiments, the crucible includes first and second layers of grains the first layer including grains forming an inside surface thereof and the second layer being superposed with the first layer. The crucible may be fabricated from tungsten-rhenium (W—Re) alloys; rhenium (Re); tantalum monocarbide (TaC); tantalum nitride (Ta$_2$N); hafnium nitride (HfN); a mixture of tungsten and tantalum (W—Ta); tungsten (W); and combinations thereof.

32 Claims, 3 Drawing Sheets

U.S. PATENT DOCUMENTS

| | | | |
|---|---|---|---|
| 6,048,813 | A | 4/2000 | Hunter |
| 6,063,185 | A | 5/2000 | Hunter |
| 6,086,672 | A | 7/2000 | Hunter |
| 6,187,089 | B1 | 2/2001 | Phillips et al. |
| 6,296,956 | B1 | 10/2001 | Hunter |
| 6,719,843 | B2 * | 4/2004 | Schowalter et al. ........ 117/220 |

FOREIGN PATENT DOCUMENTS

| | | |
|---|---|---|
| JP | 2000-154090 | 6/2000 |

OTHER PUBLICATIONS

A.S. Segal S. Yu, Karpov, Yu. N. Makarov, E.N. Mokhov, A.D. Roenkov, M.G. Ramm, Yu. A. Vodakov, "On mechanisms of sublimation growth of AIN bulk crystals", *J. Crystal Growth* 211, 68-72 (2000).

B. Raghothamachar, W.M. Vetter, M. Dudley, R. Dalmau, R. Schlesser, Z. Sitar, E. Michaels, and J.W. Kolis, "Synchrotron white beam topography characterization of physical vapor transport grown AIN and ammonothermal GaN", *J. Crystal Growth* 246, 271-280 (2002).

R. Schlesser, R. Dalmau, and Z. Sitar, "Seeded growth of AlN bulk single crystals by sublimation", *J. Crystal Growth* 241, 416-420 (2002).

L.J. Schowalter, G.A. Slack, J.B. Whitlock, K. Morgan, S.B. Schujman, B. Raghothamachar, M. Dudley, and K.R. Evans, "Fabrication of native, single-crystal AIN substrates", *Phys. Stat. Sol.* (c), 104, (2003).

V. Noveski, R. Schlesser, S. Mahajan, S. Beaudoin, and Z. Sitar, "Growth of AlN crystals on AlN/SiC seeds by AlN powder sublimation in nitrogen atmosphere", *MRS Internet J. Nitride Semicond. Res. 9*, 2 (2004).

V. Noveski, R. Schlesser, S. Mahajan, S. Beaudoin, and Z. Sitar, "Mass transfer in AlN crystal growth at high temperatures", *J. Crystal Growth* 264, 369-378 (2004).

G.A. Slack and T.F. McNelly, "Growth of High Purity AlN Crystals", J. Cryst. Growth 34, 263 (1976).

G.A. Slack and T.F. McNelly, "AlN Single Crystals", J. Cryst. Growth 42, 560 (1977).

B. Raghothamachar, M.Dudley, J.C. Rojo, K. Morgan, and L.J. Schowalter, "X-ray Characterization of Bulk AlN Single Crystals Grown by the Sublimation Technique", submitted to J. Crystal Growth (2002). Presented at Am. Assoc. Crystal Growth Conference. Seattle, WA, Aug. 2002.

S.V. Nagender Naidu and P. Rama Rao, Editors, "Phase Diagrams of Binary Tungsten Alloys, Indian Institute of Metals", Calcutta, pp. 7-13, (1991).

R. Dalmau, B. Raghothamachar, M. Dudley, R. Schlesser, and Z. Sitar, Materials Research Society Proc. vol. 798, p. Y2.9.1 (2004).

B.M. Epelbaum, D. Hofmann, M. Bickermann, A. Winnacker, Mater. Sci. Forum 389-393, 1445 (2002).

G.A. Slack, J. Whitlock, K. Morgan, and L.J. Schowalter, Materials Research Society Proc. vol. 798, p. Y10.74.1 (2004).

* cited by examiner

POWDER METALLURGY CRUCIBLE FOR ALUMINUM NITRIDE CRYSTAL GROWTH

This application is a continuation-in-part of U.S. patent application Ser. No. 10/251,106 filed Sept. 20, 2002, now issued as U.S. Pat. No. 6,719,843, which claims the benefit of U.S. provisional application Ser. No. 60/323,947, entitled "Powder Metallurgy Tungsten Crucible for AlN Crystal Growth" filed Sep. 21, 2001. The entire disclosures of each of these applications are incorporated by reference herein.

Part of the work leading to this invention was made under a United States Government STTR Contract (N00014-97-C-0362). The U.S. Government may have certain rights in this invention.

BACKGROUND OF THE INVENTION (1) Field of the Invention

The present invention relates generally to III-nitride semiconductors and more particularly to crucibles for growing III-nitride semiconductor substrates such as aluminum nitride (AlN). Use of the crucible of this invention may enable the growth of relatively large and high quality III-nitride single crystals.

(2) Background Information

Wide bandgap semiconductor devices, based on III-nitride semiconductors, are expected to find application in several opto-electronic technologies in the areas of short wavelength emission and detection. Aluminum nitride and high aluminum concentration alloys of aluminum nitride with gallium nitride and/or with indium nitride are potentially important III-nitride semiconductors for producing deep-UV light emitting diodes with potential applications including solid-state white lighting, sterilization and disinfectant devices, compact analytical devices for the biotechnology and pharmaceutical markets, bioagent detection systems, compact uv light sources for covert communication by the Department of Defense, and for short wavelength lasers for high density data storage. In addition, single-crystal substrates of aluminum nitride are attractive for the fabrication of III-nitride semiconductor, high power radio frequency, millimeter wave, and microwave devices needed for future wireless communication base stations and for Department of Defense applications. However, one of the factors limiting the maturation of aluminum nitride, and other III-nitride, technology has been the absence of high-quality bulk nitride substrates.

One promising method for the growth of aluminum nitride single crystals for such substrates is the sublimation-recondensation technique first developed by Slack and McNelly ("Growth of High Purity AlN Crystals", J. Cryst. Growth 34, 263 (1976) and "AlN Single Crystals", J. Cryst. Growth 42, 560 (1977)), both of which are fully incorporated by reference herein. However, one of the drawbacks that limited the maximum size of the crystals was the development of leaks in the tungsten crucibles, which ultimately lead to the failure thereof, through which aluminum gas may escape. The development of crucibles that substantially eliminate this problem may provide for the growth of relatively large aluminum nitride single crystals. The need for improved crucibles for the growth of aluminum nitride single crystals has also been published, subsequent to the priority date of embodiments of the present invention, by other groups: "Properties of Crucible Materials for Bulk Growth of AlN," G. A. Slack, J. Whitlock, K. Morgan, and L. J. Schowalter, Materials Research Society Proc. Vol. 798, p. Y10.74.1 (2004); "Crucible Selection in AlN Bulk Crystal Growth," R. Dalmau, B. Raghothamachar, M. Dudley, R. Schlesser, and Z. Sitar, Materials Research Society Proc. Vol. 798, p. Y2.9.1 (2004); and "Sublimation Growth of Bulk AlN Crystals: Materials Compatibility and Crystal Quality," B. M. Epelbaum, D. Hofmann, M. Bickermann, A. Winnacker, Mater. Sci. Forum 389–393, 1445 (2002).

Therefore there exists a need for an improved crucible for growth of III-nitride.

SUMMARY OF THE INVENTION

One aspect of the present invention includes a sealable crucible for growing a III-nitride semiconductor crystal. The crucible includes a wall structure defining an interior crystal growth cavity and includes a plurality of grains. The wall structure has a thickness dimension extending in a direction substantially perpendicular to the longitudinal direction, the thickness dimension being at least about 1.5 times the average grain size.

In another aspect, this invention includes a sealable crucible for growing a III-nitride semiconductor crystal. The crucible includes an elongated wall structure extending in a longitudinal direction. The wall structure defines an interior crystal growth cavity and includes a plurality of grains. The grains effectively form at least first and second layers, the first layer including grains disposed on an inside surface of the crucible and the second layer being adjacent to the first layer.

In still another aspect, this invention includes a method for fabricating a crucible for use in growing aluminum nitride single crystals. The method includes providing a bar of powder metallurgy material and machining an elongated wall structure extending in a longitudinal direction. The wall structure defines an interior crystal growth cavity and includes a plurality of grains. The grains effectively form at least first and second layers, the first layer including grains disposed on an inside surface of the crucible and the second layer being adjacent to the first layer.

In yet another aspect, this invention includes a method for fabricating an aluminum nitride single crystal. The method includes providing a crucible having an elongated wall structure extending in a longitudinal direction; the wall structure defining an interior crystal growth cavity and including a plurality of grains, which effectively form at least first and second layers, the first layer including grains disposed on an inside surface of the crucible and the second layer being adjacent the first layer. The method further includes charging the crucible with aluminum nitride, sealing the crucible, and heating at least a portion of the crucible to a temperature in excess of about 2000 degrees C.

DETAILED DESCRIPTION

Figure 3A:
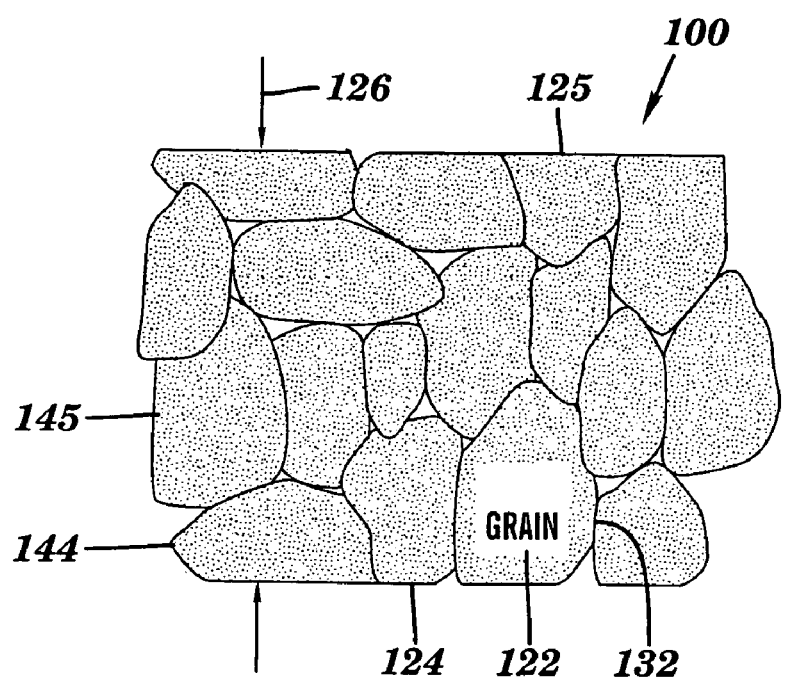
FIG. 3A is a view similar to that of FIG. 2A, of a portion of a crucible of this invention prior to grain growth.
Figure 3B:
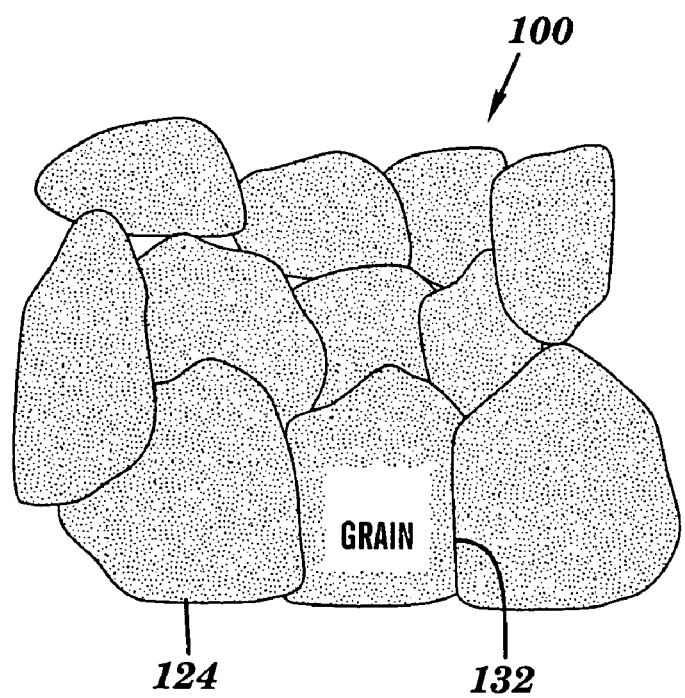
FIG. 3B is a cross sectional schematic representation of the portion of the crucible shown in FIG. 3A after exposure to Al vapor at growth temperatures.

Referring briefly to FIGS. 3A and 3B, the present invention includes a crucible that may be useful in growing relatively large aluminum nitride and/or other III-nitride single crystals for use in semiconductor applications. A tungsten crucible is described in this particular example. This is for illustrative purposes only and those skilled in the art will recognize the detailed description provided herein could be applied in a straightforward fashion to various other crucible materials such as described with respect to alternate embodiments described herein. The tungsten crucible 100 of this invention includes a wall structure having a thickness 126 that is at least about 1.5 times, and preferably greater than about 3 times, that of the average tungsten grain 122. In one embodiment, the tungsten crucible 100 is formed using powder metallurgy techniques.

The crucible of the present invention may advantageously provide for the growth of relatively large III-nitride single crystals, and in particular may provide for the growth of AlN single crystals having a diameter in the range from about 20 to about 50 mm or greater. AlN crystals of this size may be advantageously used to fabricate relatively high quality nitride semiconductor devices with relatively better yield than prior-art approaches. These and other advantages of this invention will become evident in light of the following discussion of various embodiments thereof.

Figure 1:
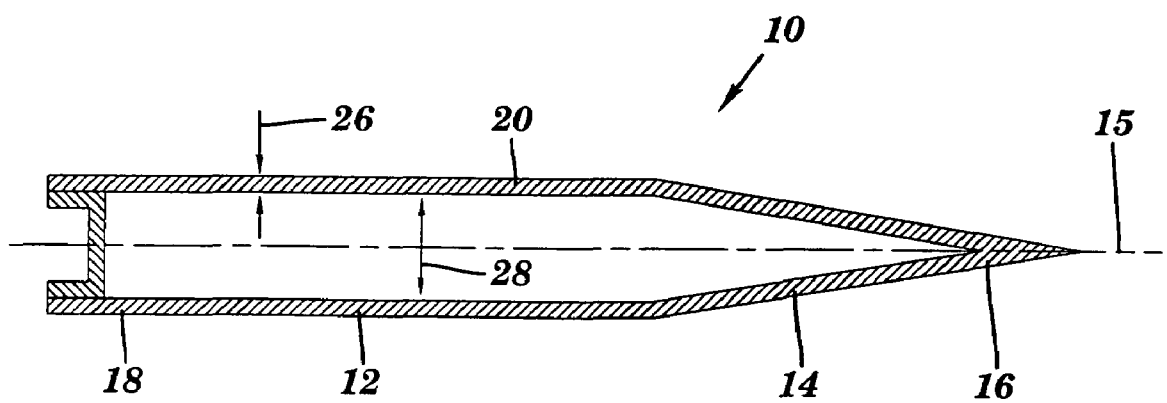
FIG. 1 is a cross-sectional schematic representation of a prior-art thin wall crucible.

Referring now to FIGS. 1–3B, prior art and the apparatus and method of the present invention are described. Referring to FIG. 1, prior-art crucible 10 typically includes a cylindrical body portion 12 and a tapered conical end portion 14 and is used in a tungsten tube furnace such as that shown in the above-referenced Slack and McNelly ("AlN Single Crystals"). To grow AlN crystals using the sublimation-recondensation technique of Slack and McNelly, the sharp tip 16 of the crucible is placed in the nominal center of the furnace at the start of run with a charge of AlN (e.g., about 5 grams) placed at the opposite end 18 of the crucible 10. The crucible 10 is rotated (e.g., at about 2 revolutions per hour) about its longitudinal axis 15 and simultaneously pushed through the hot zone (i.e., the center) of the tube furnace (with end 18 moving towards tip 16) at a rate of about 0.3 mm per hour. The center of the furnace is held at a temperature of about 2250 degrees C. during the duration of the run. The total running time may be on the order of 100 hours or more.

Figure 2A:
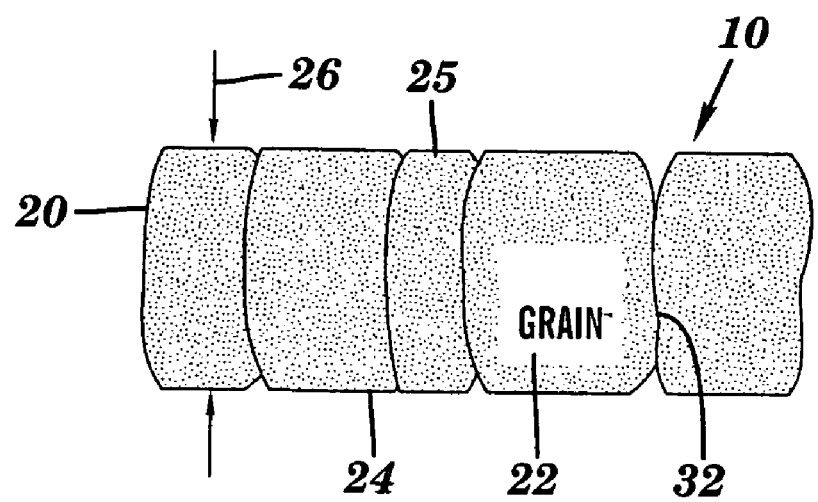
FIG. 2A is a cross-sectional schematic representation of a portion of the crucible of FIG. 1 prior to grain growth.
Figure 2B:
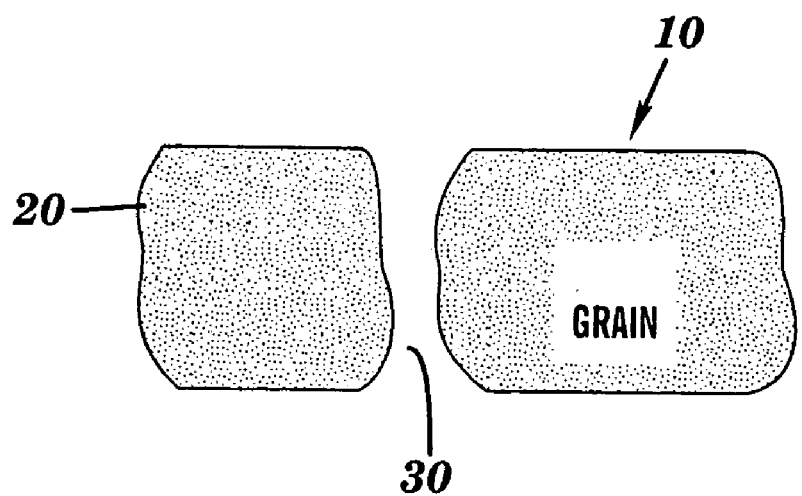
FIG. 2B is a cross-sectional schematic representation of the portion of the crucible shown in FIG. 2A after exposure to Al vapor at growth temperatures.

Referring now to FIG. 2A, these conventional crucibles 10 are formed by a chemical vapor deposition process (CVD). Crucibles 10 formed by a CVD process (e.g., using either the conventional tungsten fluoride or tungsten chloride processes) may be characterized as having a columnar grain structure in which the W grains 22 are disposed substantially perpendicular to the inner wall 24 of the crucible 10 and extend substantially the entire thickness 26 of the crucible wall 20 (i.e., from the inner wall 24 to the outer wall 25). Referring now to FIG. 2B, and as briefly described hereinabove, crucible 10 tends to develop pinhole leaks 30 at the grain boundaries 32 (FIG. 2A) thereof, which disadvantageously permit aluminum vapor to escape from the interior of the crucible 10. The pinhole leaks 30 also generally lead to crucible failure which thus limits the maximum achievable crystal size.

This problem may be circumvented, in theory, by employing single-crystal tungsten crucibles. However, such a solution is relatively difficult to implement and prohibitively expensive for commercialization.

One aspect of this invention is the realization that the above-described pinhole leak problem may be related to swelling of the tungsten grains 22 caused by the absorption of aluminum during use. Measurements conducted by the inventors have shown that after growth at 2330 degrees C. the tungsten crucible contained 5.3 atom percent aluminum in solid solution (which is approximately equivalent to the saturation value of aluminum in tungsten at that temperature). At this aluminum concentration, the lattice constant was measured to decrease slightly to 3.162 angstroms from 3.165 angstroms for pure tungsten (with aluminum atoms substitutionally replacing tungsten atoms in the lattice). Thus the absorption of aluminum should theoretically result in swelling of slightly less than 5.3 volume percent, which was corroborated by an observed swelling of about 5 volume percent.

Not wishing to be bound by a particular theory, it is believed that the swelling results in pinhole 30 formation, particularly at the triple points where three tungsten grains 22 meet. Since the grains 22 of the CVD tungsten crucibles 10 are columnar and extend the thickness 26 of the crucible wall 20, the pinholes 30 likewise extend the thickness 26 of the crucible wall 20.

Referring now to FIGS. 3A and 3B, a cross sectional schematic illustration of the tungsten grain 122 structure of the crucible 100 of the present invention is illustrated. Crucible 100 is substantially similar to crucible 10 (FIG. 1) in that it may include a cylindrical body portion 12 (FIG. 1) and a tapered conical end portion 14 (FIG. 1). Crucible 100 differs from that of crucible 10 in that it utilizes a granular, multigrain structure in which the thickness 126 of the crucible wall is at least 1.5 times that of the average grain diameter. The grain structure of this invention may also be thought of as including at least two layers, a first layer 144 adjacent to (or forming) the inner wall 124 of the crucible 100 and a second layer 145 adjacent to the first layer 144. While not wishing to be bound by a particular theory it is believed that the present invention uses the normally deleterious effects of the grain swelling to advantage, to nominally block grain boundary diffusion. It is believed that once swelling has occurred along grain boundaries 132 of the first grain layer 144, further diffusion is severely hampered by the second grain layer 145, grains of which have swollen to effectively close off any diffusion pathways or pinholes along the grain boundaries of the first layer 144. Thus, any further diffusion of aluminum into the walls of the crucible generally occurs only by relatively slow bulk diffusion. Further, the three-dimensional, substantially random arrangement of the grains 122, as illustrated in FIGS. 3A and 3B, is believed to slow the formation of pinholes in any of the layers. Nevertheless, aluminum transport through any pinholes that may be formed in the first layer 144 of tungsten grains 122 is nominally sealed off by the second layer 145 (or subsequent layers) thereof.

One method of implementing this invention is to machine crucibles from a tungsten bar formed using powder metallurgy techniques. These powder metallurgy bars include tungsten grains having substantially no columnar grain structure. As stated above, this structure is believed to reduce the penetration rate of aluminum along the grain boundaries and its subsequent escape from the crucible, particularly after the tungsten grains have swelled due to the uptake of Al by bulk in-diffusion. Crucibles formed by the above described powder metallurgy technique have been demonstrated to exhibit a significantly longer life than would be expected simply by the increased wall thickness, indicating that the granular structure slows the permeation of aluminum through the crucible walls.

The artisan of ordinary skill in the art will readily recognize that there may be alternate approaches to forming a multilayered tungsten crucible wall. One such possible approach may be to fabricate crucibles using multiple CVD steps while using an agent between steps that disrupts further columnar growth of the individual tungsten grains.

The crucible of the present invention may be useful in fabricating III-nitride single crystals such as aluminum nitride for the electronics and opto-electronics applications. For example, the inventive crucible may be used in a tube furnace, such as that disclosed by Slack and McNelly as referenced hereinabove. The crucible is typically first charged with relatively pure aluminum nitride (e.g., greater than about 99%) and then sealed before inserting into the tube furnace. At least a portion of the crucible is heated to a temperature in excess of about 2000 degrees C. at which aluminum nitride crystal formation is favored.

The crucibles of the present invention have been demonstrated to successfully grow AlN crystals having a diameter of up to 20 mm and greater. Moreover, the powder metallurgy tungsten crucibles of this invention may be used to grow AlN crystals having a diameter of up to 50 mm or greater. As described hereinabove, AlN crystals of this size may be advantageously used in the fabrication of relatively high quality nitride semiconductor devices with relatively better yield than prior approaches.

Specific exemplary embodiment(s) have been disclosed herein in which a multilayered and/or three-dimensional nominally random tungsten grain structure is produced resulting in the boundaries between tungsten grains being nominally completely blocked owing to the swelling generated by aluminum absorption. In light thereof, the skilled artisan will readily recognize that any approach to tungsten crucible construction that creates multiple layers of relatively dense tungsten grains, may be considered within the spirit and scope of this invention.

Other embodiments are also envisaged in which tungsten crucibles are subjected to a sealing process through grain swelling with metals other than aluminum. For example, Be, Cr, Pd, Ti, Pt, Rh, Ru, and V each have high temperature solubilities in tungsten (S. V. Nagender Naidu and P. Rama Rao, Editors, *Phase Diagrams of Binary Tungsten Alloys*, Indian Institute of Metals, Calcutta, (1991)). Thus they would be expected to swell the tungsten grains and nominally stop further grain boundary diffusion of the chosen metal or, on later reheating, of Al in the crucible of this invention. Metals with somewhat lower solid solubility in tungsten (such as Fe) may also be effectively contained by grain swelling although the solid solubility of Fe in tungsten is less than three percent. It may also be possible to fabricate crucibles out of metals other than tungsten in which the solid solubility of the metal contained by the crucible causes the grains of the crucible to swell and thus impede further grain boundary diffusion of the metal contained therein.

One disadvantage of tungsten crucibles is that pure tungsten tends to be quite brittle and, as a result, is difficult to machine. Accordingly, alternate embodiments of the present invention may be provided, which are substantially similar to crucible 100 described hereinabove, though fabricated from various materials other than tungsten.

For example, in particular embodiments, crucibles may be fabricated from tungsten-rhenium (W—Re) alloys, which tend to be much less brittle thus useful in situations where some machinability or flexibility is desired. Pure tungsten has a body-centered-cubic crystal structure and W—Re alloys will have nominally the same crystal structure up to 37 atom % rhenium. Aluminum atoms diffused into such W—Re alloy grains will produce the desired grain swelling and reduced grain boundary diffusion as described above. Thus, such W—Re polycrystalline alloy crucibles may be employed for growing AlN crystals. Since the W—Re mixed crystal grains have a melting point lower than that of pure tungsten, these crucibles may be limited to AlN crystal growth temperatures lower than those used for pure W. If the upper use temperature in a particular implementation is, for example, about 2350° C. for a pure tungsten crucible, then one would expect the upper growth temperature to be limited to about 2000° C. for a crucible fabricated from tungsten containing 37 atom % rhenium in an otherwise similar implementation.

Other embodiments may include crucibles fabricated from polycrystalline rhenium (Re), which has a hexagonal-close-packed crystal structure. Aluminum atoms are also substitutionally soluble in rhenium at high temperature, and may be used to eliminate porosity in polycrystalline rhenium by using a multilayer grain structure. The first (e.g., inner) layer of Re grains will also swell as described above, sealing off the later (e.g., outer) layers of grains.

Still further embodiments include crucibles fabricated from polycrystalline tantalum monocarbide, (TaC). These crucibles would also be chemically stable in the presence of AlN and in a nitrogen atmosphere of up to 100 bars at 2300° C. Thus, crucibles of TaC may be useful for growing AlN. However, polycrystalline crucibles of TaC would generally be slightly porous and Al vapor will leak out of them during growth unless a multilayer grain structure is used such as described hereinabove. One way the present invention may be applied to these crucibles is by fabricating them using a powder mixture of TaC with added $Ta_2C$. For instance, a pressed and sintered crucible, using powder metallurgy, may be made from about 10 volume percent of $Ta_2C$ added to the TaC. When the sintered crucible is fired in $CH_4$, $C_2H_2$, or other suitable hydrocarbon gas at 2000° C. to 2500° C., the $Ta_2C$ will convert to TaC and will increase its volume by about 7.5% so that it would eliminate about 0.75 volume percent of porosity in the finished crucible. Employing a 50 volume percent TaC plus 50 volume percent $Ta_2C$ would enable one to fully eliminate about 3.8% volume percent porosity in the sintered body.

In a variation of these embodiments, tantalum (Ta) metal powder may be added to the TaC powder mixture at the start of the powder metallurgy process. This Ta metal will expand by about 23% in volume when converted to TaC. Thus, less second-phase material is required to make a dense TaC crucible body. Such dense, multi-grain crucibles may be very useful for growing AlN crystals as described herein.

Still further embodiments include crucibles of polycrystalline $Ta_2N$, which may be used for growing AlN crystals at temperatures up to about 2300° C. (depending on the $Ta_2N$/AlN eutectic temperature). Useful crucibles may be formed by using powder metallurgy starting with a mixture of $Ta_2N$ powder and Ta metal powder. In particular examples, after pressing and sintering, these crucibles should be heated in about 0.1 to 10 bars of $N_2$ gas at 2000° C. before use. During this heat treatment, the Ta powder grains will be converted to $Ta_2N$ and will expand by about 9.5% in volume. Thus, residual porosity in such crucibles may be nominally eliminated before being used to grow AlN crystals. Moreover, use of multilayer grain structures, such as described hereinabove, will dramatically reduce Al diffusion along the grain boundaries through the crucible walls allowing large AlN crystals to be grown.

In other embodiments, crucibles of polycrystalline hafnium nitride (HfN) may also be used for growing AlN crystals up to temperatures of about 2300° C. These powder metallurgy crucibles may be made from a mixture of HfN powder and hafnium (Hf) metal powder. If such crucibles are heated in 0.1 to 10 bars of $N_2$ gas at 2000° C. before use, the Hf powder grains will be converted to HfN and will expand by approximately 7.3% in volume during the process. Thus, residual porosity in such crucibles may be nominally eliminated before use for growing AlN crystals. And, as discussed above with respect to other embodiments, these crucibles may be fabricated with multilayer grain structures, to retard Al diffusion along the grain boundaries through the crucible walls allowing large AlN crystals to be grown.

Other embodiments include powder metallurgy crucibles fabricated from a mixture of W and Ta powders. These two metals are mutually miscible in all proportions to form homogeneous alloys. Thus, a crucible made from an alloy of, for example, 3 atom percent Ta, may be formed. A range of Ta contents from 0.5 to 10 atom percent are also possible. When such a polycrystalline crucible is heated in $N_2$ gas at 2000° C. at 0.1 to 10 bars pressure, the nitrogen atoms will diffuse into the alloy grains. There will be no chemical reaction with the W but the Ta metal will react with nitrogen to form $Ta_2N$ clusters. These $Ta_2N$ clusters have a hexagonal-close packed crystal structure and will precipitate out at the grain boundaries in the body-centered-cubic W. Thus, they will act as grain-growth inhibitors keeping the grain size of the W grains relatively small. This small-grain-structure is useful when the crucibles are exposed to Al vapor in the growth of AlN crystals. Such small grains rapidly become saturated with aluminum and thus expand to stop the grain-boundary transport of aluminum, e.g., when in a multilayer construction as discussed hereinabove. Such W—Ta crucibles should self-seal more rapidly than pure W crucibles, and thus be better for growing AlN crystals.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims.

What is claimed is:

1. A sealable crucible for growing a III-nitride semiconductor crystal, said crucible comprising an elongated wall structure extending in a longitudinal direction, said wall structure comprising a plurality of grains and defining an interior crystal growth cavity, said wall structure having a thickness dimension (i) extending in a direction substantially perpendicular to said longitudinal direction and (ii) being at least about 1.5 times the average grain size.

2. The crucible of claim 1 being sized and shaped for growing an aluminum nitride single crystal using a sublimation-recondensation technique.

3. The crucible of claim 1 wherein said plurality of grains
   (i) form at least first and second layers, said first layer including a portion of the plurality of grains forming an inside surface of said wall structure and said second layer being adjacent said first layer; and
   (ii) define a plurality of diffusion pathways within said structure, said grains swelling upon absorption of either nitrogen or the column III atoms of said III-nitride, thereby substantially obstructing at least some of the diffusion pathways.

4. The crucible of claim 3 wherein the diffusion pathways defined by boundaries between adjacent grains are substantially obstructed by others of said grains when they swell upon said absorption.

5. The crucible of claim 1 wherein said cavity includes a substantially cylindrical portion and a tapered conical end portion.

6. The crucible of claim 1 wherein said wall structure defines a cavity having a transverse dimension ranging from about 5 to about 50 millimeters.

7. The crucible of claim 1 wherein said wall structure defines a cavity having a transverse dimension greater than about 50 millimeters.

8. The crucible of claim 1 wherein said thickness dimension is at least about three times that of the average grain diameter.

9. The crucible of claim 1 comprising a material selected from the group consisting of: tungsten-rhenium (W—Re) alloys; rhenium (Re); tantalum monocarbide (TaC); tantalum nitride ($Ta_2N$); hafnium nitride (HfN); a mixture of tungsten and tantalum (W—Ta); tungsten (W); and combinations thereof.

10. A method for fabricating a crucible for use in growing aluminum nitride single crystals, said method comprising fabricating a wall structure from a granular material, the wall structure defining an interior crystal growth cavity and comprising a plurality of grains, said grains forming at least first and second layers, the first layer including a portion of the plurality of grains forming an inside surface of the wall structure and the second layer being superimposed on the first layer.

11. The method of claim 10, wherein the granular material is selected from the group consisting of: tungsten-rhenium (W—Re) alloys; rhenium (Re); tantalum monocarbide (TaC); tantalum nitride ($Ta_2N$); hafnium nitride (HfN); a mixture of tungsten and tantalum (W—Ta); tungsten (W); and combinations thereof.

12. The method of claim 10 wherein at least a portion of the wall structure is fabricated by steps comprising:
   (i) pressing the granular material into a desired shape;
   (ii) sintering the granular material to form a sintered structure; and
   (iii) heating the sintered structure at a temperature ranging from at least about 2000° C. to about 2500° C. under conditions suitable to effect grain swelling.

13. The method of claim 12, wherein, in step (iii), the sintered structure is heated in an atmosphere selected from the group consisting of inert atmospheres and chemically active atmospheres.

14. The method of claim 10 wherein at least a portion of the wall structure is fabricated by steps comprising:
   (i) mixing TaC powder and $Ta_2C$ powder to form a mixture;
   (ii) pressing the mixture into a desired shape;
   (iii) sintering the mixture to form a sintered structure; and
   (iv) heating the sintered structure in an atmosphere comprising one or more hydrocarbon gases at a temperature ranging from at least about 2000° C. to about 2500° C. to convert at least a portion of $Ta_2C$ in the sintered structure to TaC.

15. The method of claim 14, wherein the mixture comprises between about 10 and about 50 percent of $Ta_2C$ by volume.

16. The method of claim 14, wherein step (i) further comprises adding Ta to the mixture.

17. The method of claim 10 wherein at least a portion of the wall structure is fabricated by steps comprising:

(i) mixing Ta$_2$N powder and Ta powder to form a mixture;
(ii) pressing the mixture into a desired shape;
(iii) sintering the mixture to form a sintered structure; and
(iv) heating the sintered structure in an atmosphere comprising N$_2$ gas at a temperature ranging from at least about 2000° C. to about 2500° C. and a pressure ranging from about 0.1 to about 10 bars to convert at least a portion of Ta in the sintered structure to Ta$_2$N.

18. The method of claim 10 wherein at least a portion of the wall structure is fabricated by steps comprising:
(i) mixing HfN powder and hafnium (Hf) powder to form a mixture;
(ii) pressing the mixture into a desired shape;
(iii) sintering the mixture to form a sintered structure; and
(iv) heating the sintered structure in an atmosphere comprising N$_2$ gas at a temperature ranging from at least about 2000° C. to about 2500° C. and a pressure ranging from about 0.1 to about 10 bars to convert at least a portion of Hf in the sintered structure to HfN.

19. The method of claim 10 wherein at least a portion of the wall structure is fabricated by steps comprising:
(i) mixing W powder and Ta powder to form a mixture;
(ii) pressing the mixture into a desired shape;
(iii) sintering the mixture to form a sintered structure; and
(iv) heating the sintered structure in an atmosphere comprising N$_2$ gas at a temperature ranging from at least about 2000° C. to about 2500° C. and a pressure ranging from about 0.1 to about 10 bars to convert at least a portion of Ta in the sintered structure to Ta$_2$N.

20. The method of claim 19, wherein the mixture comprises between about 0.5 and about 10 atom percent of Ta.

21. A method for fabricating an aluminum nitride crystal, said method comprising:
(i). depositing aluminum nitride in a crystal growth cavity of a crucible comprising an elongated wall structure defining the crystal growth cavity, the elongated wall structure comprising a plurality of grains, the grains forming at least first and second layers, the first layer including grains forming an inside surface of the wall structure and the second layer being superimposed on the first layer;
(ii). sealing the crucible; and
(iii). heating at least a portion of the crucible to a temperature in excess of about 2000° C.
wherein during step (iii), in at least the portion of the crucible, grains of at least the second layer swell to substantially obstruct diffusion of aluminum along diffusion pathways defined by boundaries between grains of at least the first layer.

22. A crucible for use in the single-crystal growth of aluminum nitride, said crucible comprising a wall structure defining an interior crystal growth cavity and comprising a plurality of grains defining a plurality of diffusion pathways within said structure, said grains swelling upon absorption of at least one of aluminum and nitrogen, thereby substantially obstructing at least some of the diffusion pathways.

23. The crucible of claim 22 wherein said diffusion pathways are defined by boundaries between adjacent grains, said grains forming at least first and second layers, said first layer including grains forming an inside surface of said crucible and said second layer being superimposed on said first layer.

24. The crucible of claim 23 wherein the diffusion pathways of said first layer are substantially obstructed by swollen grains of said second layer upon absorption of at least one of aluminum and nitrogen by said grains.

25. An aluminum nitride single-crystal boule tapered to a diameter greater than about 20 mm.

26. The aluminum nitride single-crystal boule of claim 25, wherein the boule is grown in a polycrystalline crucible that comprises an elongated wall structure (i) defining a crystal growth cavity and (ii) comprising a plurality of grains.

27. The aluminum nitride single-crystal boule of claim 26 wherein the wall structure comprises a material selected from the group consisting of: tungsten-rhenium (W—Re) alloys; rhenium (Re); tantalum monocarbide (TaC); tantalum nitride (Ta$_2$N); hafnium nitride (HfN); a mixture of tungsten and tantalum (W—Ta); tungsten (W); and combinations thereof.

28. The aluminum nitride single-crystal boule of claim 26 wherein diffusion of aluminum through the wall structure during the crystal growth is substantially obstructed by grain swelling due to absorption of at least one of aluminum and nitrogen.

29. The aluminum nitride single-crystal boule of claim 25 having a diameter greater than about 50 mm.

30. The aluminum nitride single-crystal boule of claim 25 having a length greater than about 12 mm.

31. The aluminum nitride single-crystal boule of claim 25 grown at a rate of about 0.3 mm per hour.

32. The aluminum nitride single-crystal boule of claim 25 grown for a period of time greater than about 100 hours.

* * * * *